(12) United States Patent
Kriesch et al.

(10) Patent No.: US 12,620,776 B2
(45) Date of Patent: May 5, 2026

(54) CONTROL DEVICE, CONTROL SYSTEM, METHOD FOR OPERATING A CONTROL SYSTEM

(71) Applicant: CARL ZEISS SMT GMBH, Oberkochen (DE)

(72) Inventors: Arian Kriesch, Aalen (DE); Matthias Manger, Aalen (DE); Claudius Weimann, Boebingen (DE); Ulrich Vogl, Aalen (DE)

(73) Assignee: CARL ZEISS SMT GMBH, Oberkochen (DE)

( * ) Notice: Subject to any disclaimer, the term of this patent is extended or adjusted under 35 U.S.C. 154(b) by 864 days.

(21) Appl. No.: 17/876,860

(22) Filed: Jul. 29, 2022

(65) Prior Publication Data

US 2022/0368104 A1 Nov. 17, 2022

Related U.S. Application Data

(63) Continuation of application No. PCT/EP2021/050976, filed on Jan. 19, 2021.

(30) Foreign Application Priority Data

Jan. 31, 2020 (DE) ..................... 10 2020 201 211.3

(51) Int. Cl.
 *H01S 5/0687* (2006.01)
 *H01S 3/08* (2023.01)
 (Continued)

(52) U.S. Cl.
 CPC .............. *H01S 5/0687* (2013.01); *H01S 3/08* (2013.01); *H01S 3/1303* (2013.01); *H01S 5/021* (2013.01)

(58) Field of Classification Search
 CPC .......... H01S 5/0687; H01S 5/068; H01S 3/13; H01S 5/0085; H01S 3/1305; H01S 3/1392
 See application file for complete search history.

(56) References Cited

U.S. PATENT DOCUMENTS 4,071,005 A 1/1978 Nakajima et al.
6,516,014 B1 * 2/2003 Sellin .................... H01S 3/1303
 372/18

(Continued)

FOREIGN PATENT DOCUMENTS

CN 101694921 A 4/2010
CN 104006809 A 8/2014
 (Continued)

OTHER PUBLICATIONS

International Preliminary Report on Patentability, PCT/EP2021/050976, Jul. 28, 2022, 9 pages.
 (Continued)

*Primary Examiner* — Minsun O Harvey
*Assistant Examiner* — Alexander Ehrlich
(74) *Attorney, Agent, or Firm* — Edell, Shapiro & Finnan, LLC

(57) ABSTRACT

A control system for frequency control of a laser module, comprising at least one laser module for generating laser radiation, at least one control device coupled or configured to couple to the laser module, and at least one optical resonator coupled or configured to couple to the control device, wherein the control device comprises a semiconductor substrate, a first Pound-Drever-Hall system arranged on the semiconductor substrate and at least one second Pound-Drever-Hall system arranged on the semiconductor substrate, wherein the laser module is coupled to the first Pound-Drever-Hall system of the control device and is configured to couple to the at least second Pound-Drever- (Continued)

Hall system of the control device, wherein the first Pound-Drever-Hall system is coupled to the optical resonator and wherein the second Pound-Drever-Hall system is configured to couple to the optical resonator, and wherein the number of Pound-Drever-Hall systems is greater than the number of laser modules or optical resonators.

18 Claims, 8 Drawing Sheets

(51) Int. Cl.
    *H01S 3/13*         (2006.01)
    *H01S 5/02*         (2006.01)

(56) References Cited

U.S. PATENT DOCUMENTS

| | | | |
|---|---|---|---|
| 7,039,080 B1 * | 5/2006 | Talmadge | H01S 3/09408 |
| | | | 372/29.02 |
| 7,327,471 B2 * | 2/2008 | Tiemann | H01S 3/13 |
| | | | 356/519 |
| 7,697,579 B1 * | 4/2010 | Delfyett | H01S 3/1109 |
| | | | 372/18 |
| 8,947,671 B2 | 2/2015 | Strandjord et al. | |
| 9,903,808 B2 * | 2/2018 | Plusquellic | G01N 21/39 |
| 9,986,628 B2 * | 5/2018 | Loopstra | H01S 3/08059 |
| 10,050,704 B1 * | 8/2018 | Yap | H01S 5/0687 |
| 2006/0192970 A1 * | 8/2006 | Tiemann | H01S 3/13 |
| | | | 356/454 |
| 2013/0044772 A1 | 2/2013 | Ensher et al. | |
| 2014/0320856 A1 | 10/2014 | McKeever et al. | |
| 2015/0159990 A1 | 6/2015 | Plusquellic et al. | |
| 2015/0296602 A1 | 10/2015 | Loopstra et al. | |
| 2017/0012705 A1 | 1/2017 | Vahala et al. | |
| 2017/0163002 A1 * | 6/2017 | Tokito | H01S 5/06825 |
| 2018/0115136 A1 | 4/2018 | Delfyett et al. | |
| 2019/0312402 A1 | 10/2019 | Lucas et al. | |

FOREIGN PATENT DOCUMENTS

| | | |
|---|---|---|
| CN | 105552706 A | 5/2016 |
| WO | 2013016249 A2 | 1/2013 |
| WO | 2013040143 A2 | 3/2013 |

OTHER PUBLICATIONS

Biedermann, "Menlo Systems ORS1500 Optical Reference System: Design and Performance", Jul. 1, 2013, 8 pages.

Zhao et al, "Sub-hertz frequency stabilization of a commercial diode laser", Apr. 26, 2009, 9 pages.

Toptica Photonics; Tunable Diode Lasers, UV, Visible, Infrared-Digital Control-Wavelength Stabilization 2018, 27 pages.

Alnis et al., "Subhertz linewidth diode lasers by stabilization to vibrationally and thermally compensated ultralow-expansion glass Fabry-Perot cavities", Physical Review A 77, 2008, 10 pages.

Drever et al., "Laser Phase and Frequency Stabilization Using an Optical Resonator", Appl. Phys. B 31, (1983) pp. 97-105.

International Search Report, PCT/EP2021/05976, Apr. 16, 2021, 17 pages.

King et al., "Design of digital Pound-Drever-Hall frequency stabilizing system for two-cavity dual-frequency Nd: YAG laser", SPIE, vol. 8759, Jan. 31, 2013, 7 pages.

Idjadi et al., "Integrated Pound-Drever-Hall laser stabilization system in silicon", Nature Communications, vol. 8, No. 1, Oct. 31, 2017, 9 pages.

German Office Action with English translation, Application 10 2020 201 211.3, Jul. 15, 2020, 11 pages.

Taiwan Office Action with English translation, Application No. 110103360, Jan. 6, 2025, 8 pages.

Taiwan Search Report with no English translation, Jan. 31, 2020, 1 page.

Chinese Office Action with English translation, Application No. 202180011899.5, Mar. 25, 2025, 15 pages.

Chinese Office Action with English translation, Application No. 202180011899.5, Sep. 30, 2025, 28 pages.

* cited by examiner

CONTROL DEVICE, CONTROL SYSTEM, METHOD FOR OPERATING A CONTROL SYSTEM

CROSS-REFERENCE TO RELATED APPLICATION

This is a Continuation of International Application PCT/EP2021/050976, which has an international filing date of Jan. 19, 2021, and the disclosure of which is incorporated in its entirety into the present Continuation by reference. This Continuation also claims foreign priority under 35 U.S.C. § 119(a)-(d) to and also incorporates by reference, in its entirety, German Patent Application DE 10 2020 201 211.3 filed on Jan. 31, 2020.

FIELD

The techniques of this disclosure relate to a control device, comprising a semiconductor substrate and a first Pound-Drever-Hall system arranged on the semiconductor substrate.

BACKGROUND

The disclosed techniques further relate to a control system, a method for operating the control system, and a projection exposure apparatus comprising such a control system.

Control devices of the type mentioned in the Field are known from the related art. In this regard, a control device comprising a semiconductor substrate and a first Pound-Drever-Hall system embodied on the semiconductor substrate is described for example in Idjadi et al., Integrated Pound-Drever-Hall laser stabilization system in silicon, Nature Communications 8, 1-9 (2017). In that case, the control device has the effect that a frequency of a laser radiation emitted by a laser or a laser module is controllable or stabilizable to a predefinable reference frequency in such a way that the frequency of the laser radiation is equal to the reference frequency. In that case, the reference frequency is generated by an element of the control device itself.

Further control devices are known from Dreyer, R. W. P. et al., Laser phase and frequency stabilization using an optical resonator, Appl. Phys. B Photophysics Laser Chem. 31, 97-105 (1983) and the documents WO2013/016249A2, US2013/0044772A1, WO2013/040143A2, Alnis et al., Sub-hertz linewidth diode lasers by stabilization to vibrationally and thermally compensated ultralow-expansion glass Fabry-Perot cavities, Phys. Rev. A—At. Mol. Opt. Phys. 88 (2008), Zhao et al., Sub-Hertz frequency stabilization of a commercial diode laser, Opt. Commun. 283, 4696-4700 (2019), Toptica-Photonics GmbH. Product catalog and data sheets, Tuneable Diode Lasers, copied 2020, page 41 and Biedermann, B., Menlo Systems ORS1500 Optical Reference System: Design and Performance (2013).

Against the background above, it is an object of the disclosed techniques to provide an improved control device and an improved control system.

SUMMARY

According to an aspect, the disclosed techniques provide for at least one second Pound-Drever-Hall system being arranged (e.g., embodied, integrated, monolithically formed, attached, bonded, etc.) on the semiconductor substrate of a control system. Consequently, at least two, in particular more than ten, preferably more than 50, Pound-Drever-Hall systems are embodied on the semiconductor substrate. The advantage here is that a single component or a single control device is made available which includes a plurality of Pound-Drever-Hall systems, which are operable simultaneously. As an alternative to simultaneous operation, the at least second Pound-Drever-Hall system is employable or usable depending on demand. "Depending on demand" means, for example, that the at least one second Pound-Drever-Hall system serves or is provided as a backup system with respect to the first Pound-Drever-Hall system, such that the second Pound-Drever-Hall system takes over or can take over the function or task of the first Pound-Drever-Hall system when, for example, the functionality of the first Pound-Drever-Hall system is faulty, critically degraded or impaired. Furthermore, the control device may be produced in a manner that is cost-effective and saves structural space because the respective Pound-Drever-Hall systems are embodied or able to be embodied on one and the same semiconductor substrate.

In accordance with one embodiment, the first Pound-Drever-Hall system and the at least one second Pound-Drever-Hall system are separately driveable. This provides the advantage that the Pound-Drever-Hall systems are operable in a targeted manner, such as independently of one another. By way of example, this ensures that the at least two Pound-Drever-Hall systems can be operated or are operable simultaneously or alternatively in a manner offset in time with respect to one another.

In accordance with a further embodiment, the control device includes at least one controller configured to drive the first Pound-Drever-Hall system and the at least one second Pound-Drever-Hall system. The advantage here is that the plurality of Pound-Drever-Hall systems are driveable in a simple manner, such as centrally driven by a single controller. The controller is preferably a separate controller, i.e., not embodied on the semiconductor substrate, which is connected to the control device in terms of signalling, such as in a wire-based manner.

In accordance with a further embodiment, the disclosed techniques provide for a Pound-Drever-Hall system that includes at least one driveable phase modulator and/or at least one photodetector. In particular, via the driving of the phase modulator, light radiation guided through the phase modulator is phase-modulated and/or frequency-modulated in a predefinable manner. This ensures that at least one sideband, i.e., a frequency band spaced equidistantly from a carrier frequency of the light radiation, is generated. The photodetector serves to detect or capture light radiation guided through the Pound-Drever-Hall system. The phase modulator and the photodetector are preferably connected to one another by one or more optical waveguide elements. The optical waveguide elements or a respective optical waveguide element are/is preferably formed from a glass material, polymer material and/or from silicon nitride.

In accordance with a further embodiment, the photodetector is a separate component connected cohesively to the control device. The advantage here is that a process for producing the control device is simplified since the photodetector is able to be fitted on the semiconductor substrate separately. Preferably, the photodetector is bonded onto the semiconductor substrate.

In accordance with one embodiment, the Pound-Drever-Hall system includes at least one electronic component. The at least one electronic component or the electronic components is/are for example an amplifier, an oscillator, a low-pass filter or bandpass filter, a voltage-current converter and/or an analogue-to-digital converter.

In accordance with one embodiment, the electronic component is a separate component connected cohesively to the control device. The advantage here is that a process for producing the control device is simplified since the electronic component or the electronic components is/are able to be fitted on the semiconductor substrate separately. Preferably, the electronic component or the electronic components is/are bonded onto the semiconductor substrate.

In accordance with one embodiment, the semiconductor substrate includes silicon and/or silicon nitride.

The control system, according to the disclosed techniques includes at least one laser module for generating laser radiation, at least one control device coupled or couplable (i.e., configured to couple) to the laser module, and at least one optical resonator coupled or couplable (i.e., configured to couple) to the control device, wherein the control device includes a semiconductor substrate, a first Pound-Drever-Hall system embodied on the semiconductor substrate and at least one second Pound-Drever-Hall system embodied on the semiconductor substrate. The advantage here is that a particularly accurate and particularly fast control system for controlling a frequency, in particular a carrier frequency of a light radiation of the laser module, is made available. Preferably, the frequency or carrier frequency is controlled to a resonant frequency that forms in the optical resonator. In particular, the control system ensures controllability of the frequency or carrier frequency in such a way that this frequency always is or remains equal to the resonant frequency even in the event of a change in the resonant frequency. Moreover, the advantage is afforded that a plurality of laser modules are operable and controllable in parallel by the control system The optical resonator is preferably formed by two mirror elements arranged at a distance from one another. Preferably, the control system additionally includes at least one isolator and at least one retardation plate, in particular a λ/4 or λ/2 plate or an equivalent integrated component.

In accordance with the disclosed techniques, the techniques provide for the laser module to be coupled to the first Pound-Drever-Hall system of the control device and to be couplable (i.e., configured to couple) to the at least one second Pound-Drever-Hall system of the control device. The advantage here is that the at least one second Pound-Drever-Hall system is couplable (i.e., configured to couple) to the laser module as necessary. The at least one second Pound-Drever-Hall system thus serves as a backup system for the first Pound-Drever-Hall system. In the event of a failure or faulty functionality of the first Pound-Drever-Hall system, a reliable functionality of the control device and of the control system thus continues to be ensured.

In accordance with one development, the control system includes at least two laser modules and at least three Pound-Drever-Hall systems, wherein each of the laser modules is coupled to a respective one of the first two Pound-Drever-Hall systems of the control device and wherein each of the laser modules is couplable (i.e., configured to couple) to the third Pound-Drever-Hall system of the control device. The advantage here is that the third Pound-Drever-Hall system is couplable (i.e., configured to couple) to the laser modules as necessary, such that even in the event of a failure or faulty functionality of a coupled Pound-Drever-Hall system, reliable functionality of the control device and of the control system is ensured or continues to be ensured.

In accordance with the disclosed techniques, the techniques provide for the first Pound-Drever-Hall system to be coupled to the optical resonator and for the second Pound-Drever-Hall system to be couplable (i.e., configured to couple) to the optical resonator. The advantage here is that the second Pound-Drever-Hall system is couplable (i.e., configured to couple) to the optical resonator as necessary. The second Pound-Drever-Hall system thus serves as a backup system for the first Pound-Drever-Hall system. In the event of a failure or faulty functionality of the first Pound-Drever-Hall system, a reliable functionality of the control device and of the control system thus continues to be ensured.

In accordance with one development, the disclosed techniques provide for the control system to include at least two optical resonators and at least three Pound-Drever-Hall systems, wherein each of the optical resonators is coupled to a respective one of the first two Pound-Drever-Hall system of the control device and wherein each of the optical resonators is couplable (i.e., configured to couple) to the third Pound-Drever-Hall system. The advantage here is that the third Pound-Drever-Hall system is couplable (i.e., configured to couple) to one of the optical resonators as necessary, such as in the event of a failure or faulty functionality of a coupled Pound-Drever-Hall system, reliable functionality of the control device and of the control system is ensured or continues to be ensured.

In accordance with the disclosed techniques, the techniques provide for the number of Pound-Drever-Hall systems to be greater than the number of laser modules or optical resonators. This ensures that at least one Pound-Drever-Hall system is available as a backup system or an additional system. If the control system includes more laser modules than optical resonators, then the number of Pound-Drever-Hall systems is preferably greater than the number of laser modules. If the control system includes more optical resonators than laser modules, then the number of Pound-Drever-Hall systems is preferably greater than the number of optical resonators.

In accordance with one development, the number of Pound-Drever-Hall systems is at least double the number of laser modules or optical resonators.

In accordance with one development, the control system includes at least one drive configured to drive the first Pound-Drever-Hall system and the at least one second Pound-Drever-Hall system for carrying out a coupling or decoupling. The advantage here is that a respective Pound-Drever-Hall system is couplable (i.e., configured to couple) to or decouplable (i.e., configured to decouple) from a specific laser module and/or a specific optical resonator in a targeted and simple manner.

In accordance with one embodiment, the drive is a matrix circuit, in particular an optical, photonic integrated or fibre-optic matrix circuit. The advantage here is that a coupling and/or decoupling to a Pound-Drever-Hall system is able to be carried out particularly rapidly.

In accordance with one embodiment, the laser module is coupled to at least two Pound-Drever-Hall systems. The advantage here is that laser radiation of a single laser module is or can be guided into two or more Pound-Drever-Hall systems in parallel or simultaneously. Preferably, each of the Pound-Drever-Hall systems is coupled to the one and the same optical resonator. Alternatively, each of the Pound-Drever-Hall systems is coupled to a respective optical resonator, wherein the optical resonators differ from one another. Optionally, the control system includes at least two laser modules, wherein each of the at least two laser modules is, in each case, coupled to at least two Pound-Drever-Hall systems.

In accordance with one embodiment, the laser radiation of one Pound-Drever-Hall system coupled to the laser module and the laser radiation of the other Pound-Drever-Hall system coupled to the laser module have a phase offset or frequency offset with respect to one another. In this case, "phase offset" means that the frequency or carrier frequency of the laser radiation of one Pound-Drever-Hall system coupled to the laser module and the frequency or carrier frequency of the laser radiation of the other Pound-Drever-Hall system coupled to the laser module are spaced differently, in particular equidistantly from one another. "Phase offset" should thus be understood to mean, in particular, a frequency offset. "Equidistantly" means that the frequency or carrier frequency of the laser radiation of one Pound-Drever-Hall system coupled to the laser module is an integer multiple of the frequency or carrier frequency of the laser radiation of the other Pound-Drever-Hall system coupled to the laser module. In particular, the frequency or carrier frequency of the laser radiation of one Pound-Drever-Hall system coupled to the laser module and the frequency or carrier frequency of the laser radiation of the other Pound-Drever-Hall system coupled to the laser module form a frequency comb. Preferably, the disclosed techniques provide for the spacing between the frequency or carrier frequency of the laser radiation of one Pound-Drever-Hall system coupled to the laser module and the frequency or carrier frequency of the laser radiation of the other Pound-Drever-Hall system coupled to the laser module to correspond to an integer multiple of a mode spacing between at least two resonator modes of the optical resonator.

In accordance with one embodiment, a modulator unit or modulator generates the phase offset or frequency offset. The modulator is connected between the laser module and the Pound-Drever-Hall systems. The modulator is, for example, an electro-optical modulator or electro-optical phase modulator. This affords the advantage that the phase offset or frequency offset, and thus in particular the frequency comb formed by the frequency or carrier frequency of the laser radiation of one Pound-Drever-Hall system coupled to the laser module and the frequency or carrier frequency of the laser radiation of the other Pound-Drever-Hall system coupled to the laser module, can be generated in a simple manner. The electro-optical phase modulator is thus preferably configured to generate a plurality of sidebands which form the frequency comb.

In accordance with one embodiment, the modulator includes a comb line spacing control unit or controller.

In accordance with one development, the control system includes a further photodetector unit or photodetector, wherein the photodetector is connectable or connected to a reference light source.

In accordance with one development, the control system includes a first wavelength-selective optical switch and at least one second wavelength-selective optical switch. This affords the advantage that determinable or determined comb lines of a frequency comb, in particular for frequency control, are selectable or filterable.

The method according to the disclosed techniques for operating the control system is distinguished by the features of the method claims of this application. The advantages already mentioned are afforded thereby. Further advantages and preferred features are evident from the description above and from the claims.

The method according to the disclosed techniques for carrying out frequency control for a laser module of a control system is distinguished by the method claims of this application. The advantages already mentioned are afforded thereby. Further advantages and preferred features are evident from the description above and from the claims.

In accordance with one embodiment, the frequency control is carried out by driving a comb line spacing control unit or controller.

The illumination system according to the disclosed techniques for a projection exposure apparatus for extreme ultraviolet (EUV) lithography having the features of the claims directed to an illumination system is distinguished by a control system according to any of the claims directed to a control system. The advantages already mentioned are afforded thereby. Further advantages and preferred features are evident from the description above and from the claims.

The projection system according to the disclosed techniques for a projection exposure apparatus for EUV lithography having the features of any of the claims directed to a projection system is distinguished by a control system according to any the claims directed to a control system. The advantages already mentioned are afforded thereby. Further advantages and preferred features are evident from the description above and from the claims.

The projection exposure apparatus according to the disclosed techniques for EUV lithography having the features of the claims directed to a projection exposure apparatus is distinguished by a control system according to any of the claims directed to a control system. The advantages already mentioned are afforded thereby. Further advantages and preferred features are evident from the description above and from the claims.

BRIEF DESCRIPTION OF THE DRAWINGS

The disclosed techniques will be explained in greater detail below with reference to the drawings. In this respect.

DETAILED DESCRIPTION

Figure 1:
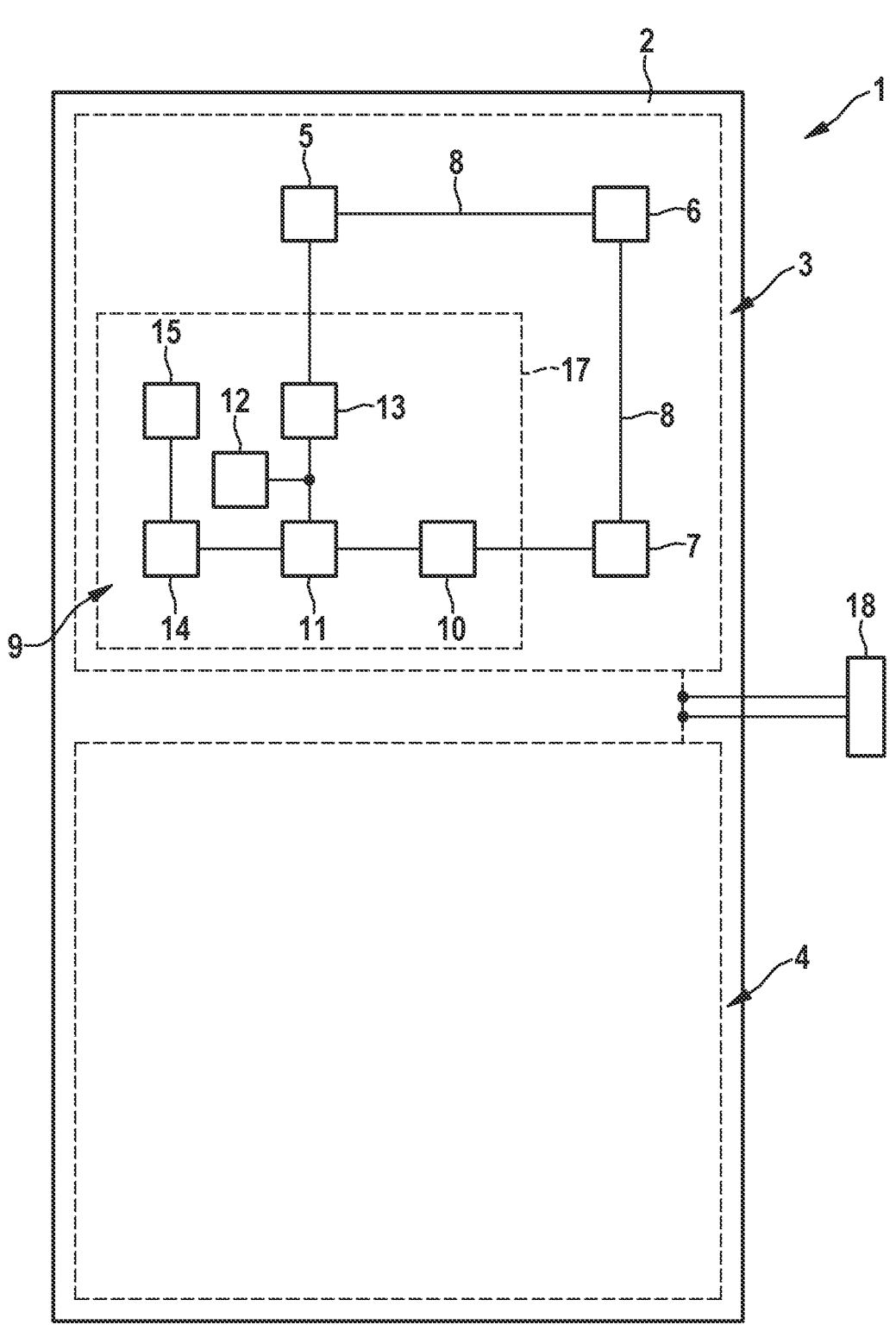
FIG. 1 shows a schematic illustration of a control device in accordance with one exemplary embodiment.

FIG. 1 shows a control device 1 in accordance with a first exemplary embodiment in a simplified illustration. The control device 1 includes a semiconductor substrate 2, a first Pound-Drever-Hall system 3 embodied on the semiconductor substrate 2, and a second Pound-Drever-Hall system 4 embodied on the semiconductor substrate 2. Optionally, more than two Pound-Drever-Hall systems 3, 4, in particular more than ten, preferably more than fifty, optionally more than a hundred, are embodied on the semiconductor substrate 2.

A respective Pound-Drever-Hall system 3, 4 includes at least one phase modulator unit or modulator 5, at least one beam splitter element 6 formed, for example, by one or more partly transmissive mirrors or by, in particular, coupled waveguides, and at least one photodetector unit or photodetector 7. Preferably, the phase modulator 5, the beam splitter element 6 and the photodetector 7 are connected to one another by optical waveguide elements 8. The waveguide elements 8 are preferably formed from a glass material, polymer material, silicon and/or silicon nitride. The phase modulator 5, the beam splitter element 6 and the waveguide elements 8 are preferably monolithically integrated in the semiconductor substrate 2 or embodied thereon. The photodetector 7 is preferably monolithically integrated in the semiconductor substrate 2 or embodied thereon. Optionally, the photodetector 7 is a separate component connected to the control device 1, in particular the semiconductor substrate 2, cohesively, for example by a bond connection.

Furthermore, a respective Pound-Drever-Hall system 3, 4 includes at least one electronic component 9. In the present case, a respective Pound-Drever-Hall system 3, 4 includes a plurality of electronic components 9, in particular, an electronic amplifier 10, an electronic mixing element 11, an electronic oscillator 12, an electronic driver element 13 for driving the phase modulator 5, a low-pass filter element 14, a voltage-current converter 15 and/or an analogue-to-digital converter (not illustrated here). Preferably, the electronic components 9 are each monolithically integrated or embodied in the semiconductor substrate 2. Optionally, at least one of the electronic components 9 is a separate component connected to the control device 1, in particular the semiconductor substrate 2 of the control device 1, cohesively, for example by a bond connection. Optionally, all the electronic components 9 form a component module 17, which is connectable or connected to the control device 1, in particular the semiconductor substrate 2 of the control device 1, cohesively, for example by a bond connection.

Both the first and the second Pound-Drever-Hall system 3, 4 are driveable. This ensures independent operation of the respective Pound-Drever-Hall systems 3, 4. For driving the Pound-Drever-Hall systems 3, 4, the control device 1 includes a controller 18, wherein the controller 18 is connected to the Pound-Drever-Hall systems 3, 4 in terms of signalling.

Preferably, the control device 1 is embodied as a photonic integrated circuit.

Preferably, the semiconductor substrate 2 includes silicon, silicon oxide and/or silicon nitride.

Figure 2:
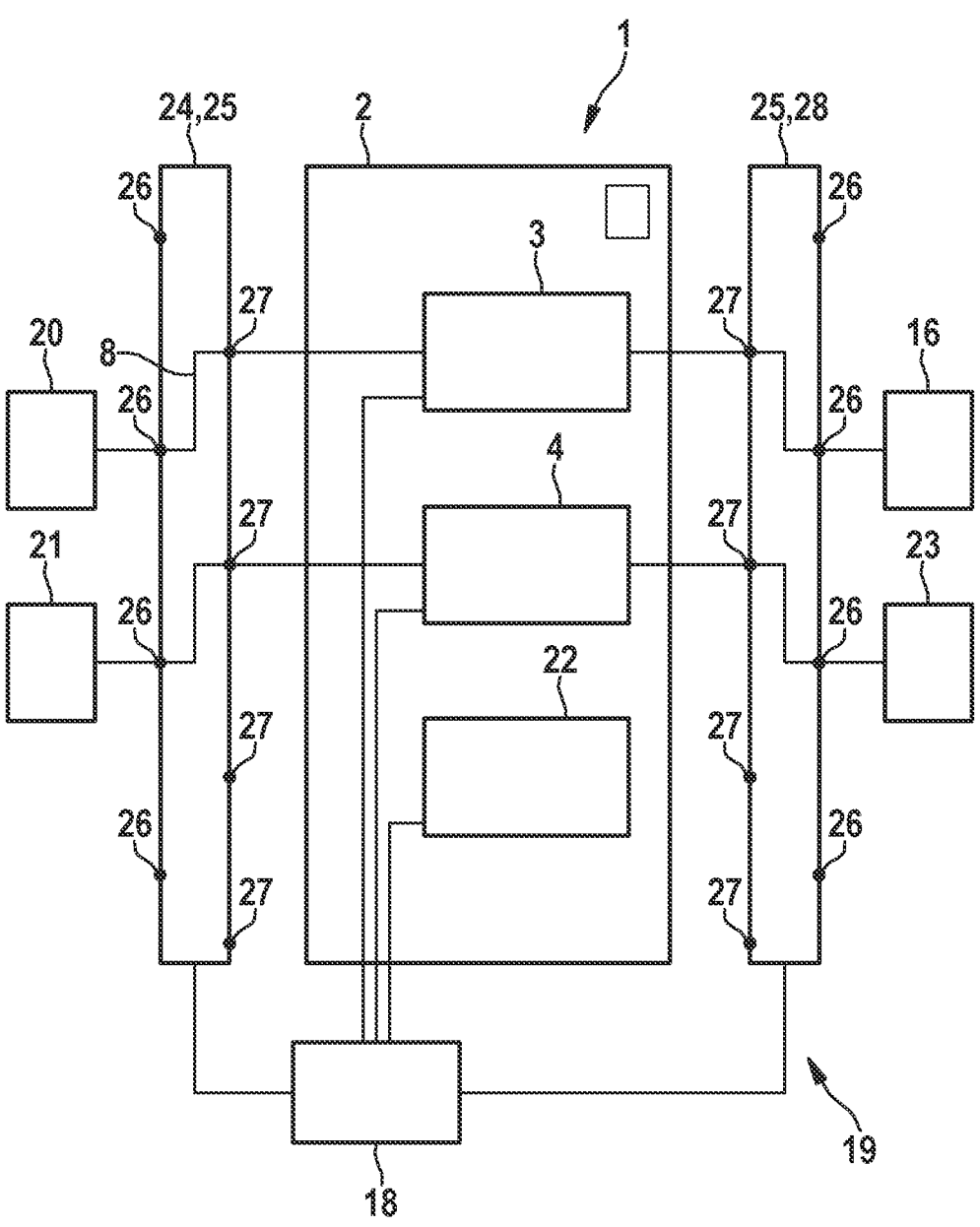
FIG. 2 shows a schematic illustration of a control system in accordance with a first exemplary embodiment.

FIG. 2 shows a control system 19 in accordance with a first exemplary embodiment in a simplified illustration. The control system 19 includes at least one laser module 20, in the present case two laser modules 20, 21, the control device 1, which includes three Pound-Drever-Hall systems 3, 4, 22 in accordance with the exemplary embodiment, and at least one optical resonator 16, in the present case two optical resonators 16, 23. The control system 19 serves for frequency control or frequency stabilization of a respective laser module 20, 21, and in particular of a frequency or carrier frequency of a respective laser module 20, 21. The laser modules 20, 21 are preferably embodied as tunable, continuously operable laser modules 20, 21, such as laser diodes.

In the present case, one of the laser modules 20 is coupled to the Pound-Drever-Hall system 3 and the other of the laser modules 21 is coupled to the Pound-Drever-Hall system 4. "Coupled" means, as explained with respect to the example of the laser module 20 and the Pound-Drever-Hall system 3, that there is a signalling connection between the laser module 20 and the Pound-Drever-Hall system 3. Laser radiation emitted by the laser module 20 is thus guided into the Pound-Drever-Hall system 3, such as by a waveguide element 8. The Pound-Drever-Hall system 22, coupled to none of the laser modules 20, 21 in the present example, is a couplable Pound-Drever-Hall system.

Furthermore, the optical resonator 16 is coupled to the Pound-Drever-Hall system 3 and the optical resonator 23 is coupled to the Pound-Drever-Hall system 4. "Coupled" means, as explained based on the example of the optical resonator 16 and the Pound-Drever-Hall system 3, that there is a signalling connection between the optical resonator 16 and the Pound-Drever-Hall system 3. Laser radiation guided into the Pound-Drever-Hall system 3 passes through a waveguide element 8 to the optical resonator 16. The Pound-Drever-Hall system 22, coupled to none of the optical resonators 16, 23 in the present example, is a couplable Pound-Drever-Hall system.

The control system 19 includes a drive unit or driver 24 configured to drive each of the three Pound-Drever-Hall systems 3, 4, 22 and/or the in the present example, two laser modules 20, 21. The driver 24, therefore, carries out a coupling of one of the laser modules 20, 21 to one of the Pound-Drever-Hall systems 3, 4, 22 and/or a decoupling of one of the laser modules 20, 21 from one of the Pound-Drever-Hall systems 3, 4, 22. The driver 24 includes a matrix circuit 25, such as a high-frequency optical matrix circuit. The driver 24 or the matrix circuit 25 preferably includes a plurality of signal inputs 26 and a plurality of signal outputs 27. Preferably, a respective signal input 26 is connectable to a respective laser module 20, 21 and a respective signal output 27 is connectable to a respective Pound-Drever-Hall system 3, 4. The driver 24 is preferably connected to the controller 18 or a further controller, not illustrated here, in terms of signalling.

The control system 19 includes in the present example a further drive unit or driver 28, e.g., an optical matrix circuit 25, and configured to drive each of the three Pound-Drever-Hall systems 3, 4, 22 and/or two optical resonators 16, 23. Accordingly, driver 28 carries out a coupling of one of the Pound-Drever-Hall systems 3, 4, 22 to one of the optical resonators 16, 23 and/or a decoupling of one of the Pound-Drever-Hall systems 3, 4, 22 from one of the optical resonators 16, 23.

Preferably, the number of Pound-Drever-Hall systems 3, 4, 22 is greater than the number of laser modules 20, 21 or optical resonators 16, 23. Preferably, the number of Pound-Drever-Hall systems 3, 4, 22 is at least double the magnitude of the number of laser modules 20, 21 or optical resonators 16, 23. This ensures that a sufficient number of additional, in particular couplable, Pound-Drever-Hall systems 3, 4, 22, or Pound-Drever-Hall systems serving as backups, are always available.

Optionally, the control device 1 includes an optical isolator, not illustrated here, and/or a retardation plate, for example a λ/4 plate. The isolator and/or the retardation plate are/is preferably arranged between the control device 1 and the optical resonator 16, 23.

Optionally, at least one of the laser modules 20, 21, in particular all of the laser modules 20, 21, is/are part of the control device 1 itself. The laser module 20, 21 is thus optionally embodied on the semiconductor substrate 2 of the control device 1.

Figure 3:
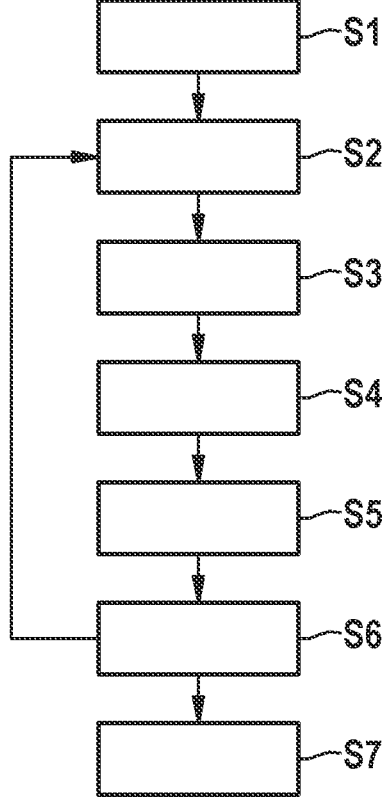
FIG. 3 shows a flow diagram for the frequency stabilization or frequency control of a laser module in accordance with one exemplary embodiment.

FIG. 3 shows a flow diagram for the frequency stabilization or frequency control of a laser module. For the sake of simplicity, the method is described using the example of the laser module 20, the Pound-Drever-Hall system 3 and the optical resonator 16.

In a first step S1, the laser module 20 is coupled to the Pound-Drever-Hall system 3. The coupling is effected by the driver 24.

In a second step S2, laser radiation having a predefinable or predetermined frequency, referred to hereinafter as a carrier frequency, is generated by the laser module 20 and guided into the Pound-Drever-Hall system 3.

In a third step S3, the laser radiation passes into the phase modulator 5. The phase modulator is driven to generate at least one sideband, in particular a plurality of sidebands. "Sidebands" are taken to mean in the present case frequencies spaced equidistantly from the carrier frequency of the laser radiation.

In a fourth step S4, the laser radiation passes to the beam splitter element 15. There one part of the laser radiation (first partial beam), having the carrier frequency, is deflected in the direction of the photodetector 7. Another part of the laser radiation (second partial beam) is directed in the direction of the optical resonator 16. The optical resonator 16 is preferably formed by two mirror elements, or in particular coupled waveguide elements, arranged at a predefinable or predetermined distance from one another. The part of the laser radiation which impinges on the optical resonator 16 passes into the optical resonator 16, is reflected in the optical resonator 16, passes back to the beam splitter 15 and is then deflected in the direction of the photodetector 7. The other part of the laser radiation, that is to say the laser radiation which passes through the optical resonator 16, likewise has the carrier frequency, wherein said carrier frequency can have a frequency-dependent phase shift as a result of the, in particular complex, reflectivity of the optical resonator 16.

In a fifth step S5, the carrier frequency of the first partial beam is superimposed and compared with the carrier frequency of the second partial beam. The superimposition is effected in the photodetector 7.

The sixth step S6 involves monitoring for a deviation between the carrier frequency of the first partial beam and the carrier frequency of the second partial beam. This is effected, in particular, depending on a superimposition of the carrier frequency of the second partial beam with the carrier frequency of the first partial beam and the sidebands generated by the phase modulator 5. If the detected deviation is equal to zero, which can be determined on, for example, the basis of the photocurrent generated depending on the superimposition, then the method continues at step S2. The deviation is zero if the carrier frequency of the laser module 20 is equal to the resonant frequency of the optical resonator 16. Additionally or alternatively, the deviation is zero if the carrier frequency of the first partial beam is equal to the carrier frequency of the second partial beam, wherein the carrier frequency of the second partial beam is or must be equal to the resonant frequency of the optical resonator 16.

If the detected deviation is not equal to zero, then in a seventh step S7 the carrier frequency of the laser module 20 is controlled in such a way that becomes equal to the resonant frequency of the optical resonator 16. The control is effected by an electrical correction current or control current which is generated based on the photocurrent, in particular through the electronic components 9, and is fed to the laser module 20.

The advantage of both the control system 19 and of the method is that the frequency or carrier frequency of the laser module 20, 21 reacts or can react to changes in the optical resonator 16, 23, in particular changes in length, particularly rapidly and particularly accurately. The carrier frequency is thus continuously controllable in such a way that it is equal to the resonant frequency of the optical resonator 16. The embodiment of at least two Pound-Drever-Hall systems 3, 4 on one and the same semiconductor substrate 2 ensures that, in a manner that is cost-effective and saves structural space, a plurality of optical resonators 16, 23 are or can be monitored simultaneously and independently of one another and the carrier frequency of a plurality of Pound-Drever-Hall systems 3, 4 is thus continuously controllable.

Figure 4:
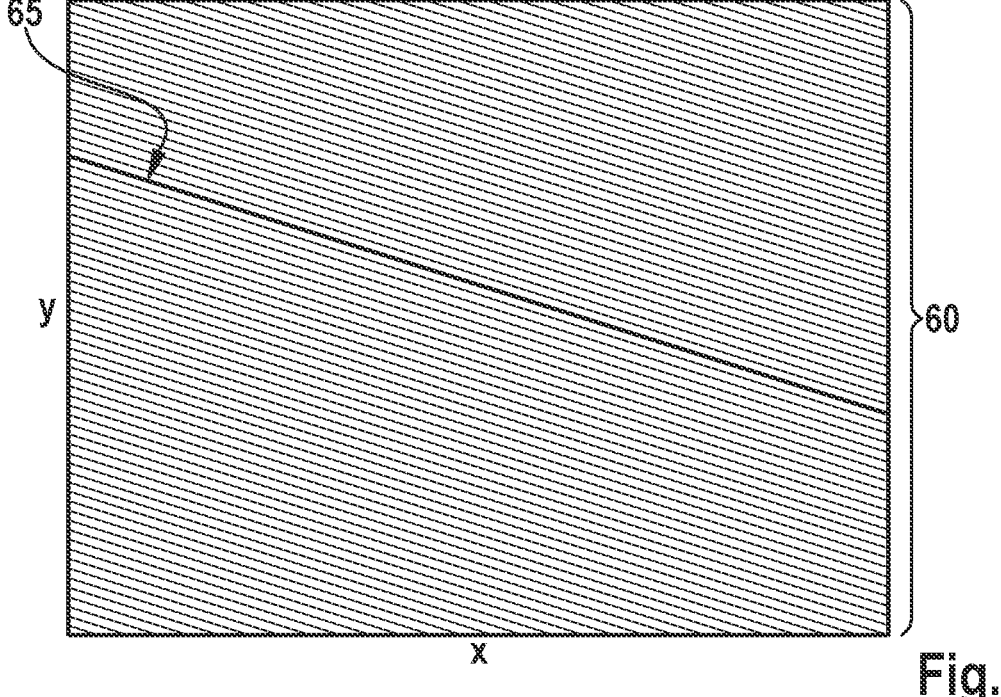
FIG. 4 shows a frequency profile of a frequency of the laser module controlled by the control system in accordance with a first exemplary embodiment.

FIG. 4 illustrates one example of a frequency profile in which the carrier frequency, represented by reference sign 65 in the present example, is controlled. In this example, the lines running obliquely represents modes or resonant modes which form or can form in the optical resonator 16. The length of the optical resonator 16 is represented on the x-axis, designated by X in the present example, and the carrier frequency or laser frequency is represented on the y-axis, designated by Y in the present example. Depending on the length of the optical resonator 16, the carrier frequency is controlled so that it remains at the same mode. The bandwidth of the tunability of the laser module 20, represented by the reference sign 60 in the present example, is preferably between 100 GHz and 10000 GHz, inclusive, preferably between 1000 GHz and 10000 GHz, inclusive, and particularly preferably between 1000 GHz and 5000 GHz, inclusive.

Figure 5:
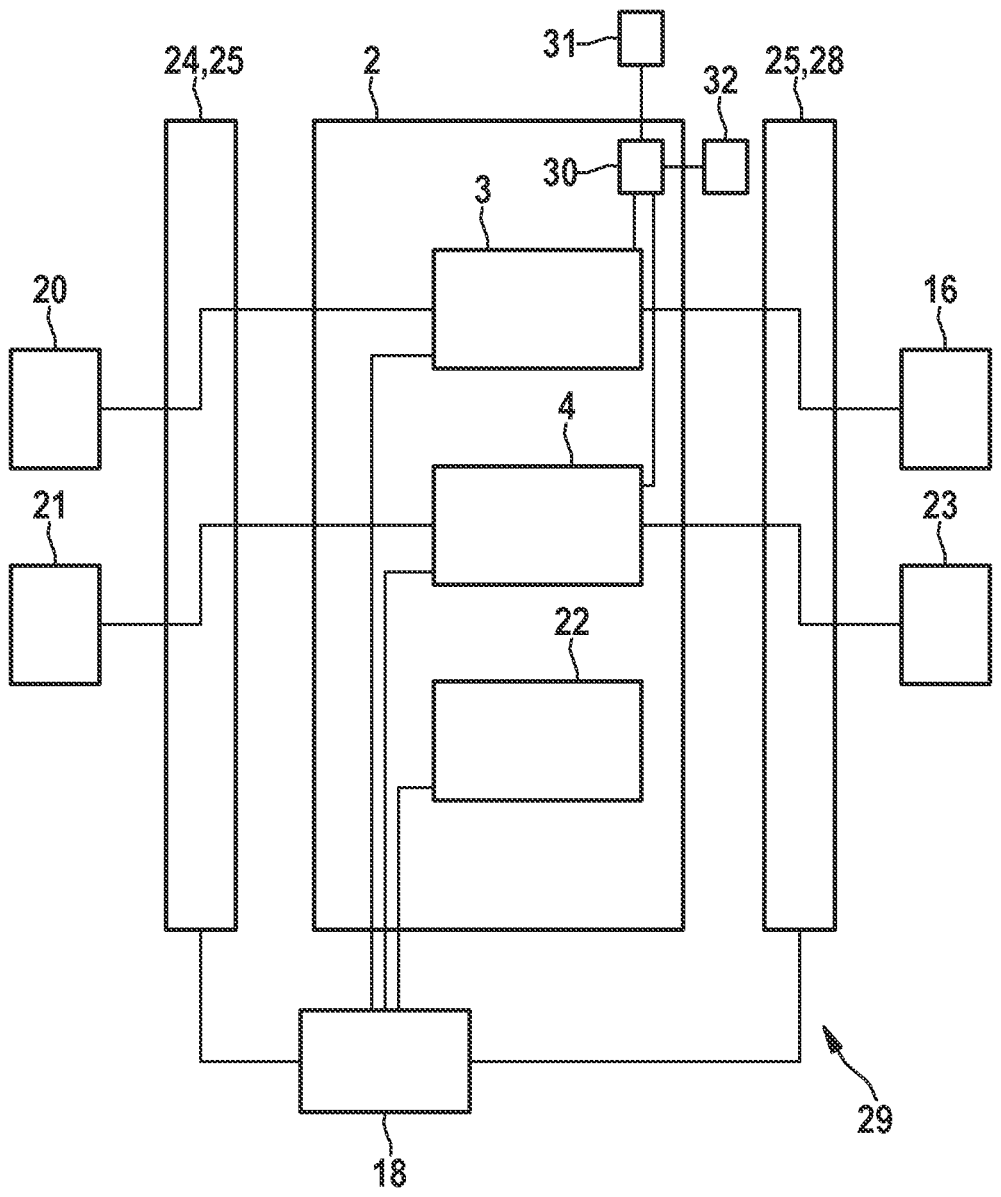
FIG. 5 shows a schematic illustration of a control system in accordance with a second exemplary embodiment.

FIG. 5 shows a control system 29 in accordance with a second exemplary embodiment in a simplified illustration. The control system 29 corresponds to the control system 19 described in FIG. 2 with the difference that the control system 29 additionally includes a further photodetector 30, for example a photodiode, in particular a quadruple photodiode. The further photodetector 30 is a separate component or alternatively part of the control device 1 itself, that is to say is embodied on the semiconductor substrate 2 of the control device 1. The further photodetector 30 is connected to a reference light source 31, configured for generating a reference carrier frequency or reference frequency, in terms of signalling. In addition, at least one sideband, in particular a plurality of sidebands, with respect to the reference carrier frequency is/are generated. The reference light source 31 preferably includes a frequency comb generator for generating the at least one sideband, in particular a frequency comb. In the further photodetector 30, the, in particular controlled, carrier frequency of the laser module 20, 21 is superimposed with the reference carrier frequency or the frequency comb. The photodetector 31 is connected to an evaluation 32 in terms of signalling. The evaluation unit or evaluator 32 effects monitoring for a deviation between the carrier frequency and the reference carrier frequency or the frequency comb. If the detected deviation is equal to zero, i.e., if the carrier frequency is equal to the reference carrier frequency, then the change in length of the optical resonator 16 is zero. If the detected deviation is not equal to zero, i.e., the carrier frequency is not equal to the reference carrier frequency, then a change in length of the optical resonator 16 is determined depending on a position or change in position of the carrier frequency relative to the reference carrier frequency, in particular relative to the respective sideband or the respective sidebands. "Change in length" in the present case means a change in distance, for example owing to a transverse displacement, or a change in position, for example owing to a tilting, of the mirror elements of the optical resonator 16, 23 with respect to one another.

Figure 6:
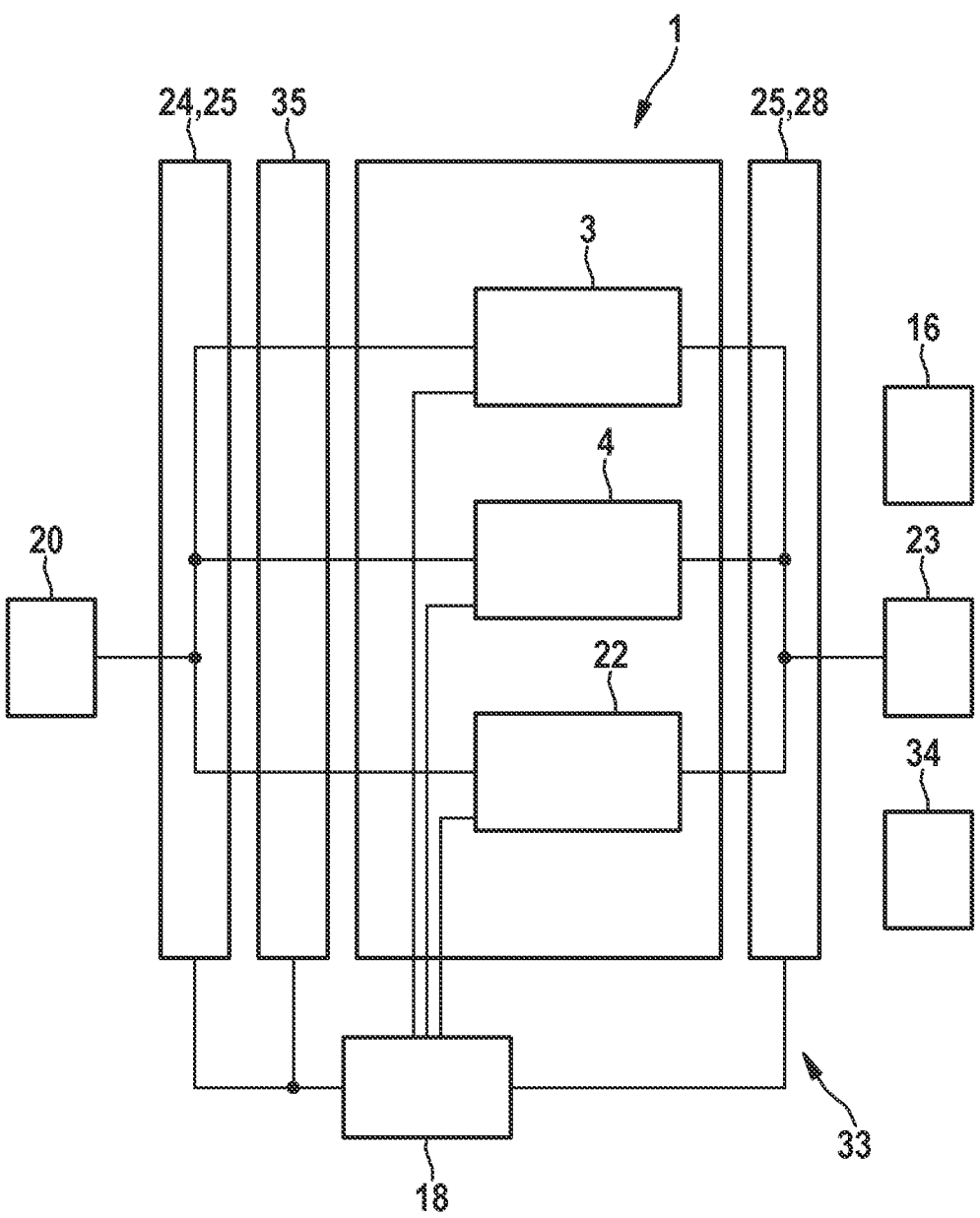
FIG. 6 shows a schematic illustration of a control system in accordance with a third exemplary embodiment.

FIG. 6 shows a control system 33 in accordance with a third exemplary embodiment in a simplified illustration. In the present case, the control system 33 includes a laser module 20, the control device 1, which in accordance with the exemplary embodiment includes at least two, in the present case three, Pound-Drever-Hall systems 3, 4, 22, and also at least one optical resonator, in the present case three optical resonators 16, 23, 34.

In the present case, the laser module 20 is coupled to each of the three Pound-Drever-Hall systems 3, 4, 22. In the present example, the carrier frequencies of the laser radiation guided into the respective Pound-Drever-Hall systems have a phase offset or frequency offset with respect to one another. A modulator unit or modulator 35 generates the phase offset or frequency offset and is connected between the laser module 20 and the Pound-Drever-Hall systems 3, 4, 22. The modulator 35 is preferably embodied as an electro-optical modulator. Preferably, the modulator 35 is connected to the controller 18 in terms of signalling for the purpose of driving by the controller 18. In particular, a frequency comb is generated by the phase offset or frequency offset. That means that the carrier frequencies or comb lines of the respective laser radiation guided into the Pound-Drever-Hall systems 3, 4, 22 are spaced equidistantly from one another. In other words: the laser radiation which is coupled or is couplable (i.e., configured to couple) into the optical resonator 16 has a frequency comb spectrum. The latter is characterized by a plurality of frequencies with the same frequency spacing. A frequency spacing corresponding to an integer multiple of a mode spacing between at least two resonator modes of the optical resonator 16 is preferably chosen.

The advantage here is that, particularly for the present example where each of the Pound-Drever-Hall systems 3, 4, 22 is coupled to one and the same optical resonator, to the optical resonator 16 is monitorable by a plurality of Pound-Drever-Hall systems 3, 4, 22. This is advantageous particularly if a bandwidth of the tunability of the laser module is limited, for example less than 1000 GHz, and in particular less than 100 GHz.

By way of example, if the carrier frequency of the Pound-Drever-Hall system 3, referred to as first carrier frequency 36 in the present example, is controlled depending on the resonant frequency of the optical resonator 16, and if the carrier frequency reaches a limit of the tunability of the laser module 20, then another of the Pound-Drever-Hall systems 4, 22 is preferably driven. This driven Pound-Drever-Hall system 4, 22 is, in particular, such a Pound-Drever-Hall system 4 into which a second carrier frequency 37 adjacent equidistantly with respect to the first carrier frequency is introduced. The frequency control is then effected based on this second carrier frequency 37. If this second carrier frequency reaches the limit of the tunability of the laser module 20, then another of the Pound-Drever-Hall systems 3, 22 is preferably driven, for example a Pound-Drever-Hall system 4 into which a third carrier frequency 38 adjacent equidistantly with respect to the second carrier frequency 37 is introduced. A respective Pound-Drever-Hall system 3, 4, 22 is driven depending on the developing or current resonant frequency of the optical resonator 16.

Figure 7:
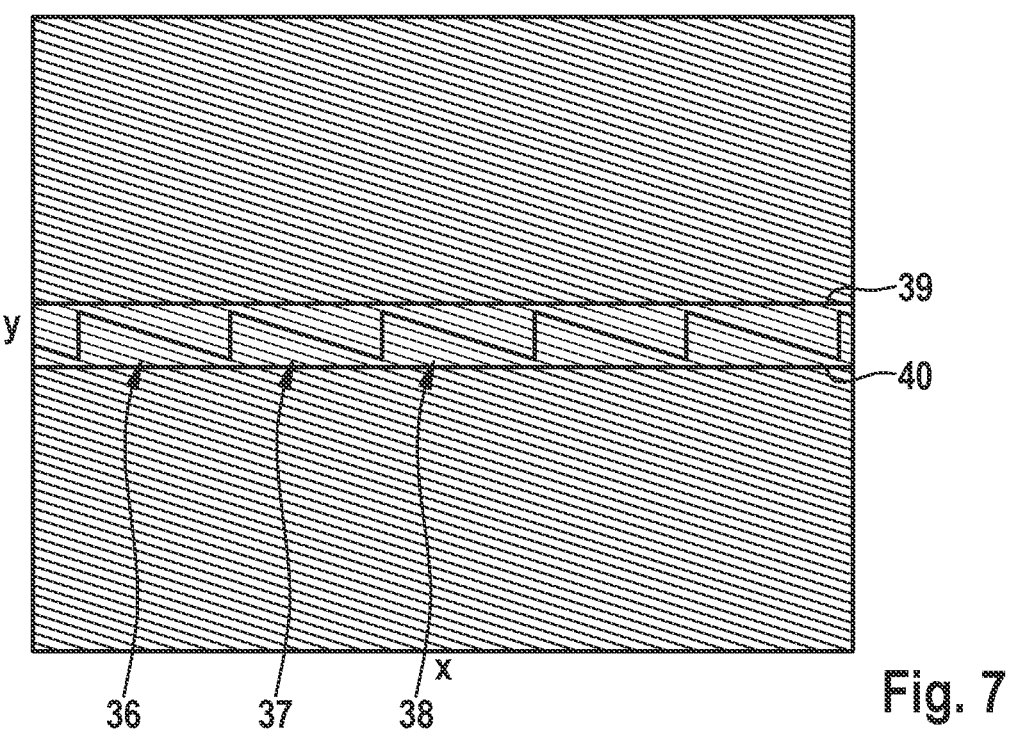
FIG. 7 shows a frequency profile of a controlled frequency of the laser module in accordance with a second exemplary embodiment.

FIG. 7 illustrates an example frequency profile in which the carrier frequency is controlled in accordance with the control system 33 described with regard to FIG. 6.

The first carrier frequency 36, the second carrier frequency 37, the third carrier frequency 38 and optional further carrier frequencies are illustrated. Switching to a respective carrier frequency 36, 37, 38 is effected if the limit, that is to say either an upper limit 39 or a lower limit 40, of the tunability of the laser module 20 is reached. The bandwidth of the tunability of the laser module, that is to say the spacing between the upper limit 39 and the lower limit 40, is, for example, a maximum of 100 GHz, and in particular a maximum of 1000 GHz.

Figure 8:
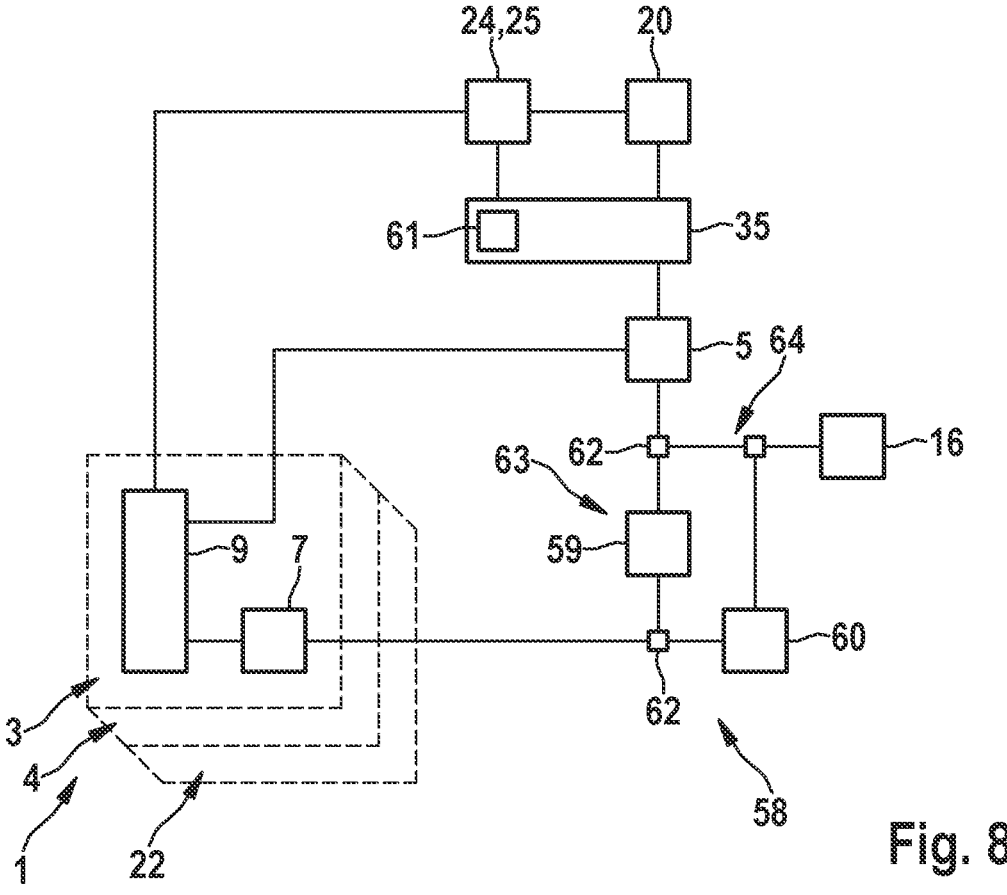
FIG. 8 shows a schematic illustration of a control system in accordance with a fourth exemplary embodiment

FIG. 8 shows a control system 58 in accordance with a fourth exemplary embodiment in a simplified illustration. In the present example, the control system 58 includes a laser module 20, the control device 1, which includes at least two and in this example three Pound-Drever-Hall systems 3, 4, 22, and also at least one optical resonator 16. The control system furthermore includes a first wavelength-selective optical switch 59 and a second wavelength-selective optical switch 60, and also the driver 24 and the modulator 35.

In the present example, the laser module 20 is coupled or couplable (i.e., configured to couple) to each of the three Pound-Drever-Hall systems 3, 4, 22. A frequency comb is generated from the carrier frequency of the laser module 20 by the modulator 35. The number of comb lines of the frequency comb preferably corresponds to the number of Pound-Drever-Hall systems 3, 4, 22. This ensures that a Pound-Drever-Hall system 3, 4, 22 is or can be locked onto a comb line or is or can be coupled to a comb line. In the present example, a comb line spacing between two comb lines of the frequency comb is settable in a variable manner, in particular by the driving of the modulator 35 by the controller 18. Preferably, the modulator 35 includes a driveable comb line spacing control unit or controller 61 configured to set the comb line spacing in a variable manner.

The frequency comb generated from the laser radiation is guided into a phase modulator 5. The latter generates at least one sideband with respect to each comb line generated. The laser radiation is subsequently separated into a first partial beam 63 and a second partial beam 64 by a beam splitter 62. The first partial beam 63 is guided to the first wavelength-selective optical switch 59. The second partial beam 64 is guided to the optical resonator 16 and then to the second wavelength-selective optical switch 60. In the present example, the first partial beam 63 is the light beam having the carrier frequency. The second partial beam 64, that is to say the laser radiation which passes through the optical resonator 16, likewise has the carrier frequency, wherein this carrier frequency can have a frequency-dependent phase shift as a result of, for example, the complex reflectivity of the optical resonator 16.

According to this example, the wavelength-selective optical switches 59, 60 are configured to switch or filter an output comb line or output frequency from the three comb lines or input frequencies. The wavelength-selective optical switches 59, 60 filter the same comb line, for example the first, second or third comb line. The respectively switched or filtered output comb lines are combined in a further beam splitter 62 and pass to the photodetector 7, in which the comb lines are superimposed.

Optionally, the control system 19 described with regard to FIG. 2 or the control system 29 described with regard to FIG. 5 include the wavelength-selective optical switches 59, 60 and optionally the comb line spacing controller 61.

Optionally, the control systems 33, 58 include at least two laser modules 20, 21, wherein each of the at least two laser modules 20, 21 is respectively coupled to at least two Pound-Drever-Hall systems 3, 4, 22.

Figure 9:
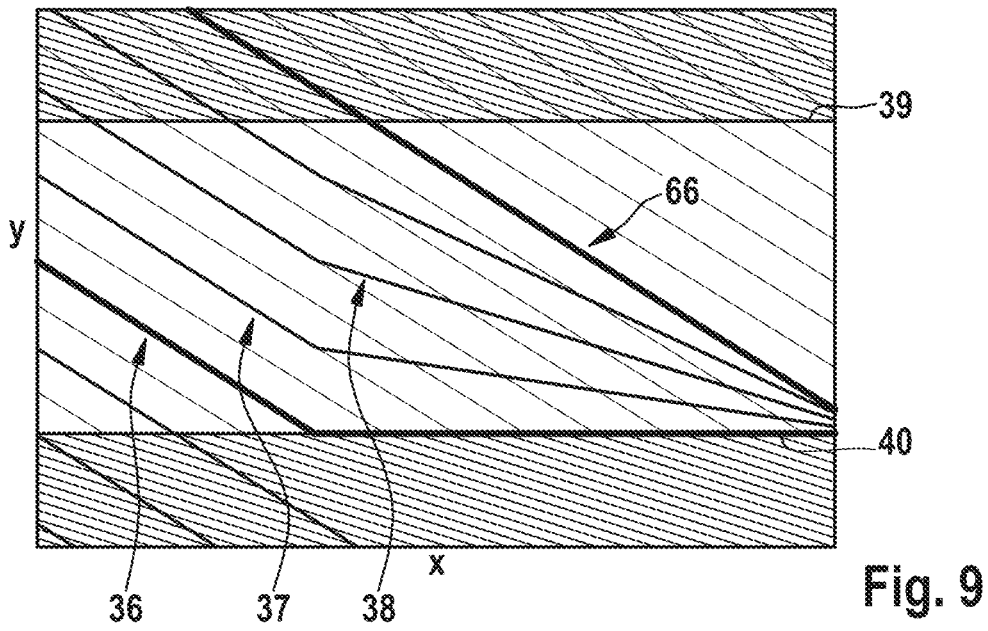
FIG. 9 shows a frequency profile of a controlled frequency of the laser module in accordance with a third exemplary embodiment.

Illustrated in FIG. 9 is one example of a frequency profile in which the carrier frequency is controlled in accordance with the control system 58 described with regard to FIG. 8. The first carrier frequency 36 or first comb line, the second carrier frequency 37 or second comb line, the third carrier frequency 38 or third comb line and optional further carrier frequencies or comb lines are illustrated. The modulator 35, in particular the comb line spacing controller 61, is driven if the comb line which is locked or coupled to a resonator mode reaches a limit of the tunability of the laser module 20, that is to say either an upper limit 39 or a lower limit 40.

If the comb line reaches the tunability of the laser module 20, a closest adjacent comb line or carrier frequency, in the present example the comb line 66 (which in this example is or remains still coupled or locked to a resonator mode) or based on the correspondingly coupled Pound-Drever-Hall system 3, 4, 22, control or further control of the comb line spacing is then effected. This ensures that a comb line always remains or is locked to a resonator mode.

Preferably, the comb line spacing control unit or controller 61 of the modulator 35 is driven at a predefinable or predetermined point in time, for example a predefinable or predetermined time duration prior to the limit 39, 40 being reached or upon the limit 39, 40 being reached.

Figure 10:
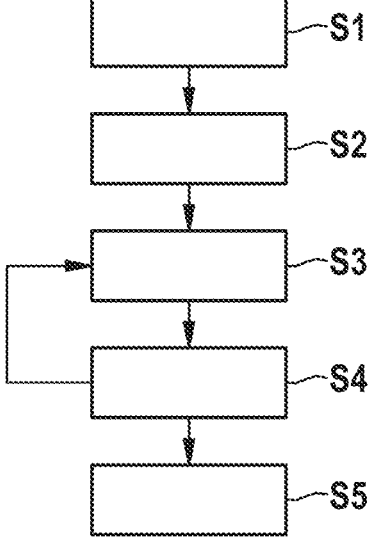
FIG. 10 shows a flow diagram for operating the control system in accordance with one exemplary embodiment.

FIG. 10 shows a flow diagram for operating the control system 19, 29, 33, 58.

In a first step S1, one Pound-Drever-Hall system 3, 4, 22 of the control device 1 and at least one other Pound-Drever-Hall system 3, 4, 22 of the control device 1 are operated or put into operation. If the control device 1 includes more than two Pound-Drever-Hall systems 3, 4, 22, then preferably all the Pound-Drever-Hall systems 3, 4, 22 are operated.

In a second step S2, the laser module 20, 21 is coupled to one of the Pound-Drever-Hall systems 3, 4, 22 of the control device 1. Optionally or additionally, the Pound-Drever-Hall system 3, 4, 22 coupled to the laser module 20, 21 is coupled to an optical resonator 16, 23, 34.

In a third step S3, at least one actual value of a predefinable electrical parameter of said one Pound-Drever-Hall system 3, 4, 22 is detected. The electrical parameter is, for example, an electrical capacitance or an electrical resistance of at least one of the electronic components 9 of the control device 1 and/or of some other element of the Pound-Drever-Hall system 3, 4, 22, for example, of the photodetector 7.

In a fourth step S4, the actual value is compared with a predefinable or predetermined setpoint value. By way of example, a detected actual resistance is compared with a predefinable or predetermined setpoint resistance. If a deviation between the actual value and the setpoint value that is less than or equal to a predefinable limit deviation is detected, then the method continues at step S3.

If a deviation between the actual value and the setpoint value that is greater than the predefinable limit deviation is detected, then in a fifth step S5 a non-functionality or critical functionality of the Pound-Drever-Hall system 3, 4, 22 is identified and the laser module 20, 21 is decoupled from the non-functional Pound-Drever-Hall system 3, 4, 22. Afterwards, the laser module 20, 21 is coupled to another, couplable Pound-Drever-Hall system 3, 4, 22. Preferably, the non-functional Pound-Drever-Hall system 3, 4, 22 is additionally decoupled from the optical resonator 16, 23, 34 and the optical resonator 16, 23, 34 is subsequently coupled to the other, couplable Pound-Drever-Hall system 3, 4, 22. A respective coupling and/or decoupling are/is effected by the drive unit or driver 24 or matrix circuit 25.

This affords the advantage that reliable monitoring of the optical resonator 16, 23, 34 is or remains ensured, even if one of the used or coupled Pound-Drever-Hall systems 3, 4, 22 is or becomes non-functional.

Figure 11:
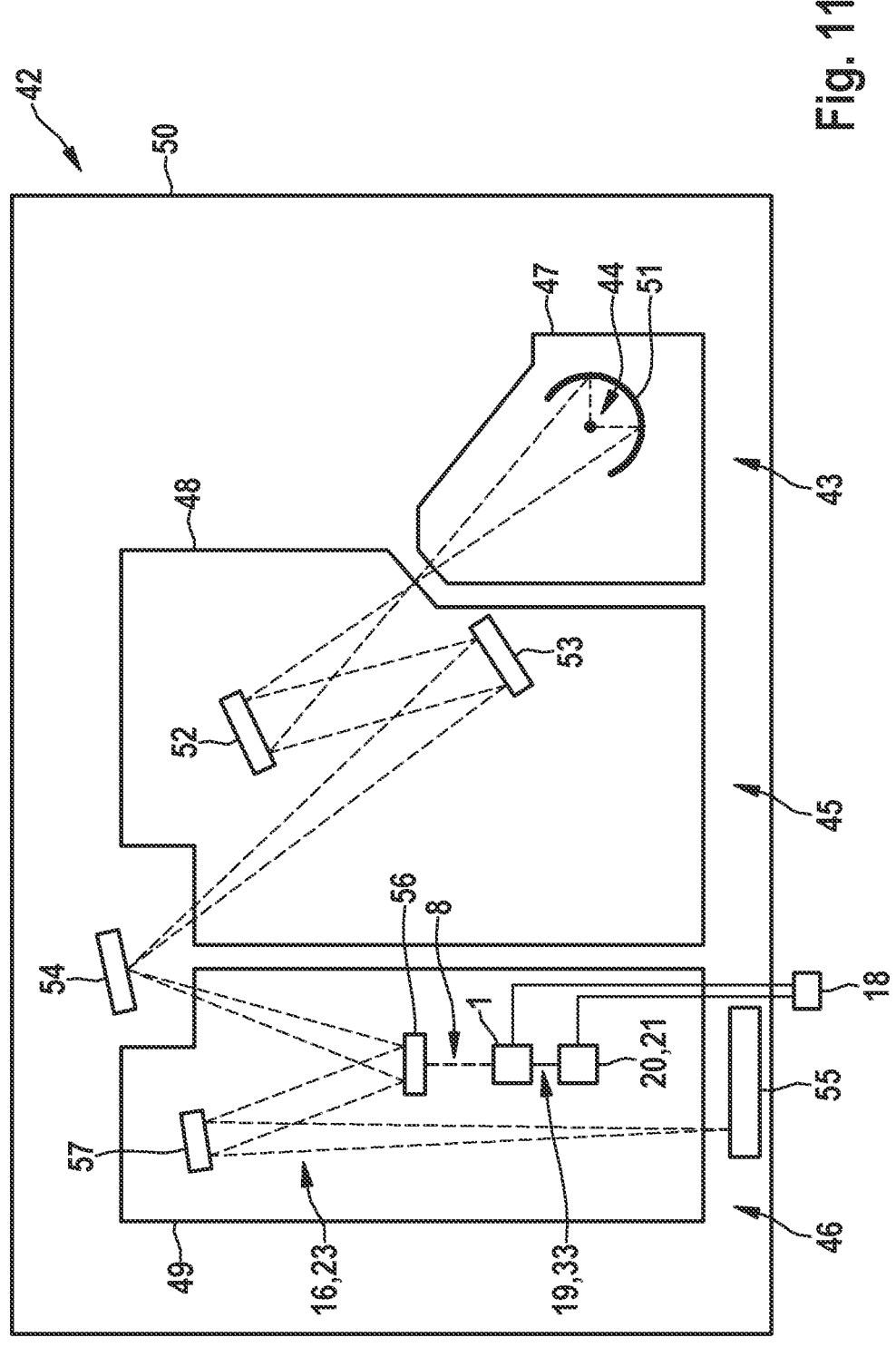
FIG. 11 shows a projection exposure apparatus comprising a control system in accordance with one exemplary embodiment.

FIG. 11 shows a projection exposure apparatus 42 for EUV lithography or an EUV lithography apparatus in accordance with one exemplary embodiment. The projection exposure apparatus 42 includes a beam generating system 43 having a driveable light source, an EUV light source 44 in the present case, which generates working light, an illumination system 45 and a projection system 46.

In accordance with the present exemplary embodiment, the beam generating system 43 includes a first housing 47, which encloses an interior of the beam generating system at least regionally, the illumination system 45 includes a second housing 48, which encloses an interior of the illumination system 45 at least regionally, and the projection system 46 includes a third housing 49, which encloses an interior of the projection system 46 at least regionally. The first, second and/or third housing 47, 48, 49 are/is embodied in each case as a partial housing of an overall housing 50 of the projection exposure apparatus 42, said overall housing being illustrated merely in a simplified way here.

The projection exposure apparatus 42, in particular the overall housing 50 or the partial housings 47, 48, 49 forming the overall housing 50, is/are operated under vacuum conditions.

In the present case, the EUV light emitted by the EUV light source 44 has, for example, a wavelength between 5 nm and 30 nm, inclusive. The EUV light emitted by the EUV light source 44 is focused in a collector mirror 51 of the beam generating device 43 and is then guided into the illumination system 45.

In the present case, the illumination system 45 includes at least one first and one second optical element 52, 53 embodied in each case as a mirror or mirror element. The EUV light introduced into the illumination system 45 is guided by the optical elements 52, 53 onto a photomask 54, or a reticle, having a structure that is imaged onto a wafer 55 on a reduced scale by the projection system 46. For this purpose, the projection system includes a third and a fourth optical element 56, 57, which are likewise embodied in each case as a mirror or mirror element.

In accordance with the present exemplary embodiment, the projection system 46 includes the control system 19, 29, 33, 58. The control system 19, 29, 33, 58 is arranged or is arrangeable completely, or preferably only partly, in the projection system 46.

As described above, the control system 19, 29, 33, 58 includes at least one laser module 20, 21 for generating laser radiation, at least one control device 1 coupled or couplable (i.e., configured to couple) to the laser module 20, 21, and at least one optical resonator 16, 23, 34 coupled or couplable (i.e., configured to couple) to the control device. Optionally, the control system 19, 29, 33, 58 additionally includes at least one driver 24 and/or at least one modulator 35.

In the present case, the third and fourth optical elements 56, 57 form the optical resonator 16, 23, 34. The control device 1 is connected to the optical resonator 16, 23, 34 by at least one optical waveguide 8, for example an optical fibre. The control system 19, 29, 33, 58, in particular the control device 1, is connected to a controller 18 in terms of signalling.

Optionally, the projection system 46 and also the illumination system 45 each include more than two, in particular three, four, five or more optical elements 52, 53, 56, 57. An optical resonator 16, 23, 34 is preferably formed by, in each case, two optical elements arranged adjacent to one another in a beam path of the working light. The illumination system 45 can thus likewise include one optical resonator 16, 23, 34 or a plurality of optical resonators 16, 23, 34. The optical resonators 16, 23, 34 of the projection system 46 and of the illumination system 45 are preferably monitorable by a single control system 19, 29, 33, 58 or a single control device 1. Optionally, the illumination system 45 includes a separate control device 1 assigned thereto or a separate control system 19, 29, 33, 58.

The advantage of the frequency stabilization by the control device 1 is that changes, in particular changes in length, of a respective optical resonator 16, 23, 34 can be detected or captured particularly accurately and particularly rapidly. Particularly accurately means that changes in length or changes in position in the picometers range are detectable. Particularly rapidly means that changes in length or changes in position in the microseconds range are detectable.

By way of example, if a change in the length of the optical resonator 16, 23, 34 or a change in the position of the optical elements forming the optical resonator 16, 23, 34 with respect to one another is detected which is greater than a predefinable or predetermined limit change, then a measure is preferably implemented which corrects or adjusts the, for example, position or location of at least one of the optical elements of the resonator 16, 23, 34. In this case, the correction is effected in such a way that the corrected length or position corresponds to a predefinable or predetermined setpoint length or predefinable or predeterminable setpoint position. Preferably, the controller 18 drives at least one of the optical elements 52, 53, 56, 57 or another element of the projection system 42 which is configured to correct or to adjust the location or position of the optical elements 52, 53, 56, 57 or of the optical resonator 16, 23, 34.

Preferably, the control device 1 includes elements for temperature regulation, in particular for heating and/or cooling, of the semiconductor substrate 2 and/or of the Pound-Drever-Hall systems 3, 4, 22. Preferably, the control device 1 includes elements for thermally insulating the semiconductor substrate 2 and/or the Pound-Drever-Hall systems 3, 4, 22. Preferably, the control device 1 includes a housing, in which the semiconductor substrate 2 and/or the Pound-Drever-Hall systems 3, 4, 22 are/is arranged at least regionally.

The use of the control device 1 and/or of the control system 19, 29, 33, 58 is not restricted to the use with a projection exposure apparatus. The control device 1 and/or the control system 19, 29, 33, 58 are/is also usable for example in or with optical coordinate measuring systems, in or with lidar (light detection and ranging) systems or in or with optical coherence tomography systems.

Preferably, the control system 19, 29, 33, 58 or the control device 1 includes a Proportional-Integral-Derivative (PID) controller, wherein the derivative (D) element of the PID controller is not equal to zero.

What is claimed is:

1. A control system for frequency control of a laser module, comprising:
   at least one laser module for generating laser radiation;
   at least one control device coupled or configured to couple to the at least one laser module; and
   at least one optical resonator coupled or configured to couple to the at least one control device;
   wherein the at least one control device comprises a semiconductor substrate, a first Pound-Drever-Hall system arranged on the semiconductor substrate and at least one second Pound-Drever-Hall system arranged on the semiconductor substrate,
   wherein the at least one laser module is configured to couple to and decouple from the first Pound-Drever-Hall system of the at least one control device and is configured to couple to the at least one second Pound-Drever-Hall system of the at least one control device,
   wherein the first Pound-Drever-Hall system is coupled to the at least one optical resonator and wherein the at least one second Pound-Drever-Hall system is configured to couple to the at least one optical resonator,
   wherein a number of Pound-Drever-Hall systems is greater than a number of laser modules or optical resonators of the control system;
   wherein the at least one laser module is coupled to at least two Pound-Drever-Hall systems; and
   wherein the laser radiation of the first Pound-Drever-Hall system and the laser radiation of the at least one second Pound-Drever-Hall system have a phase offset with respect to one another.

2. The control system of claim 1, further comprising at least one driver configured to drive the first Pound-Drever-Hall system and the at least one second Pound-Drever-Hall system for carrying out a coupling or decoupling.

3. The control system of claim 2, wherein the at least one driver is a matrix circuit.

4. The control system of claim 1, further comprising a modulator configured to generate the phase offset, wherein the modulator is connected between the at least one laser module and the first Pound-Drever-Hall system and between the at least one laser module and the at least one second Pound-Drever-Hall system.

5. The control system of claim 4, wherein the modulator comprises a comb line spacing controller.

6. The control system of claim 1, further comprising a photodetector, wherein the photodetector is connectable or connected to a reference light source.

7. The control system of claim 1, further comprising a first wavelength-selective optical switch and at least one second wavelength-selective optical switch.

8. The control system of claim 1, further comprising a Proportional-Integral-Derivative (PID) controller, wherein a derivative element of the PID controller is not equal to zero.

9. The control system of claim 1, wherein the first Pound-Drever-Hall system and the at least one second Pound-Drever-Hall system are driveable separately.

10. The control system of claim 9, further comprising at least one controller configured to drive the first Pound-Drever-Hall system and the at least one second Pound-Drever-Hall system.

11. The control system of claim 1, wherein at least one of the first Pound-Drever-Hall system or the at least one second Pound-Drever-Hall system comprises at least one driveable phase modulator and/or at least one photodetector.

12. The control system of claim 1, wherein the first Pound-Drever-Hall system or the at least one second Pound-Drever-Hall system comprises at least one electronic component.

13. The control system of claim 1, wherein the control system is incorporated into an illumination system for a projection exposure apparatus for EUV lithography, the illumination system comprising a housing enclosing an interior, and at least two optical elements arranged in the housing, wherein the at least two optical elements form an optical resonator.

14. The control system of claim 1, wherein the control system is incorporated into a projection system for a projection exposure apparatus for EUV lithography, the projection system comprising a housing enclosing an interior, and at least two optical elements arranged in the housing, wherein the at least two optical elements form an optical resonator.

15. The control system of claim 1 wherein the control system is incorporated into a projection exposure apparatus for EUV lithography, the projection exposure apparatus comprising: an illumination system and a projection system.

16. A method for operating a control system, comprising:

a) operating a first Pound-Drever-Hall system and a second Pound-Drever-Hall system;

b) coupling a laser module to one of the first Pound-Drever-Hall system or the second Pound-Drever-Hall system;

c) detecting at least one actual value of a predetermined electrical parameter of the first Pound-Drever-Hall system;

d) comparing the at least one actual value with a predetermined setpoint value;

e) decoupling the laser module from the first Pound-Drever-Hall system if a determined deviation between the at least one actual value and setpoint value is greater than a predetermined limit deviation; and f) coupling the laser module to the second Pound-Drever-Hall system.

17. A method for carrying out frequency control for a laser module of a control system, the control system comprising at least one laser module for generating laser radiation; at least one control device coupled or configured to couple to the at least one laser module and at least one optical resonator coupled or configured to couple to the at least one control device, wherein the at least one control device comprises a semiconductor substrate, a first Pound-Drever-Hall system arranged on the semiconductor substrate and at least one second Pound-Drever-Hall system arranged on the semiconductor substrate; the method comprising:

a) coupling the at least one laser module to the first Pound-Drever-Hall system, b) generating laser radiation via the at least one laser module and introducing the laser radiation into the first Pound-Drever-Hall system;

c) introducing the laser radiation, having a carrier frequency of the laser radiation, into a phase modulator and generating at least one sideband;

d) splitting the laser radiation into a first partial radiation, having a carrier frequency of the laser radiation, and a second partial radiation, having a potentially phase-shifted carrier frequency of the laser radiation;

e) superimposing the first partial radiation and the second partial radiation;

f) monitoring for a predefinable deviation between the first partial radiation and the second partial radiation;

g) controlling the carrier frequency of the laser radiation if a deviation between the first partial radiation and the second partial radiation that is greater than the predefinable deviation is identified, wherein the carrier frequency is controlled in such a way that it becomes equal to a reference frequency;

h) decoupling the at least one laser module from the first Pound-Drever-Hall system; and i) coupling the at least one laser module to the at least one second Pound-Drever-Hall system.

18. The method of claim 17, wherein the frequency control is carried out based on driving a comb line spacing controller.

* * * * *